(12) United States Patent
Tohsche

(10) Patent No.: US 7,109,772 B2
(45) Date of Patent: Sep. 19, 2006

(54) D-TYPE FLIPFLOP

(75) Inventor: Ulf Tohsche, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/695,624

(22) Filed: Oct. 28, 2003

(65) Prior Publication Data

US 2004/0135611 A1    Jul. 15, 2004

(30) Foreign Application Priority Data

Oct. 31, 2002 (DE) ................ 102 50 866

(51) Int. Cl.
*H03K 3/12* (2006.01)

(52) U.S. Cl. .............. 327/218; 327/202; 327/217

(58) Field of Classification Search ........ 327/199–203, 327/208, 210, 211, 212, 215, 217–219, 225
See application file for complete search history.

(56) References Cited

U.S. PATENT DOCUMENTS

| 4,939,384 A | 7/1990 | Shikata et al. ............ 327/218 |
| 5,173,870 A | 12/1992 | Sukashita et al. ......... 327/208 |
| 5,189,315 A * | 2/1993 | Akata ..................... 327/203 |
| 5,281,865 A * | 1/1994 | Yamashita et al. ......... 327/208 |
| 2002/0005745 A1* | 1/2002 | Robertson et al. ......... 327/218 |
| 2003/0030474 A1* | 2/2003 | McGowan ................. 327/202 |

FOREIGN PATENT DOCUMENTS

| GB | 2 202 866 A | 10/1988 |
| JP | 62-9791 | 1/1987 |
| JP | 62-40816 * | 2/1987 |
| JP | 63103511 A | 5/1988 |
| JP | 2-210907 A * | 8/1990 |

OTHER PUBLICATIONS

Weste et al. (Principles of CMOS VLSI Design: A Systems Perspective, 1993, Addison Wesley, 2nd Edition, p. 91.*

* cited by examiner

*Primary Examiner*—Long Nguyen
(74) *Attorney, Agent, or Firm*—Patterson & Sheridan, L.L.P.

(57) ABSTRACT

A flipflop having a clock input for applying a clock signal, a data input for applying a data signal, a noninverting output and an inverting output, where the flipflop has a first holding element with a first feedback loop and a second holding element with a second feedback loop, where the first and second feedback loops each have a first node and a second node, where the first holding element is designed such that upon a first clock edge of the clock signal the logic value of the data signal is transferred to the first holding element and the logic value of the data signal is made available on the first node in the first feedback loop, where the first node in the first feedback loop is coupled to the first node in the second feedback loop in order to transfer the signal value which is on the first node in the first feedback loop to the second holding element upon a second clock edge of the clock signal and to output the signal value on the noninverting output, wherein the second node in the first feedback loop is coupled to the second node in the second feedback loop in order to transfer the inverted signal value which is on the second node in the first feedback loop to the second holding element upon the second clock edge of the clock signal, where the second node in the second feedback loop corresponds to the noninverting output and the first node in the second feedback loop corresponds to the inverting output.

10 Claims, 5 Drawing Sheets

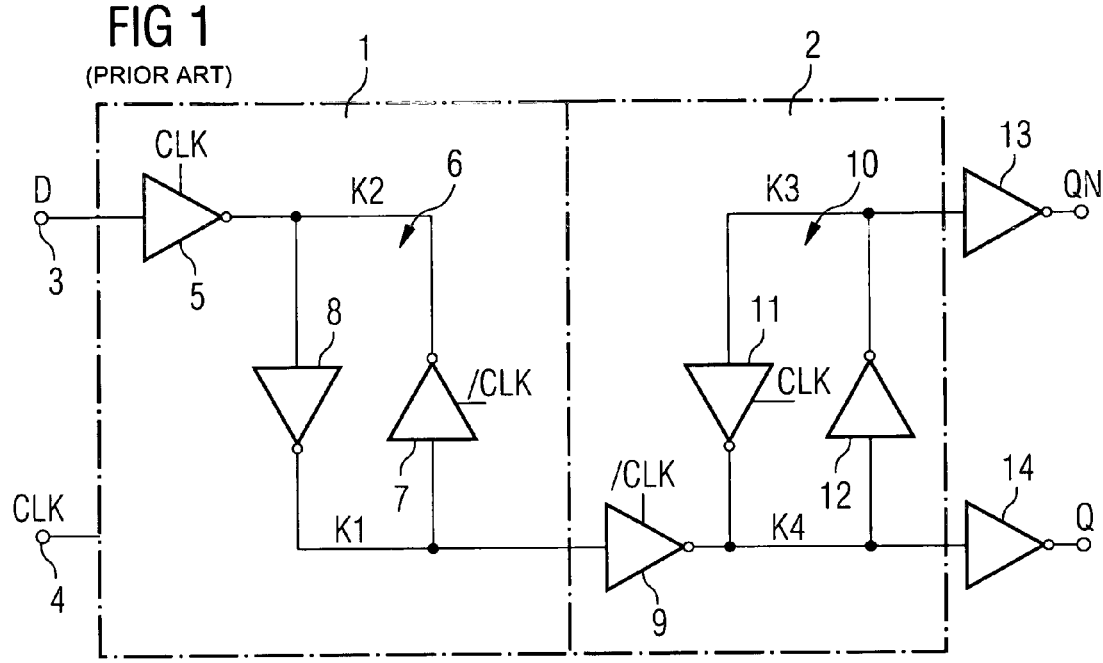
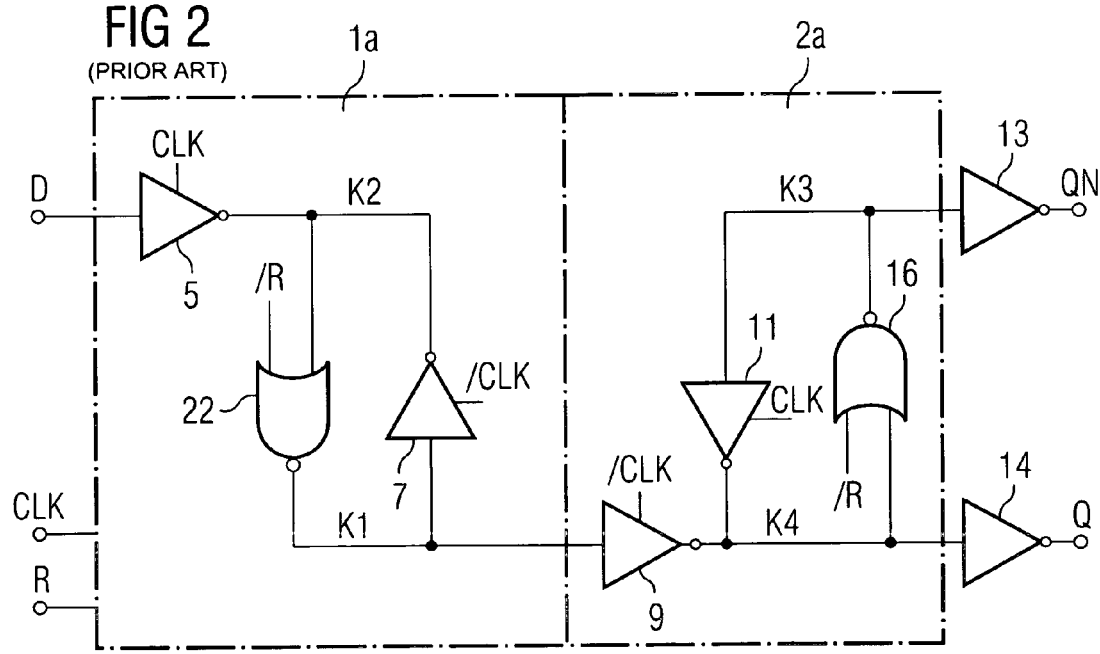

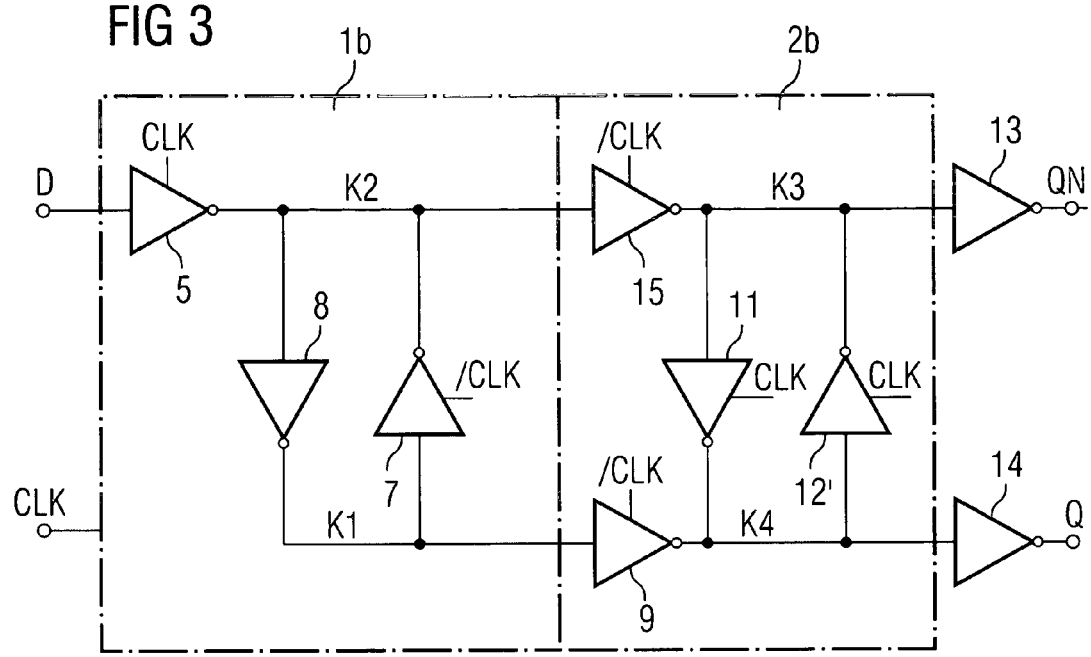
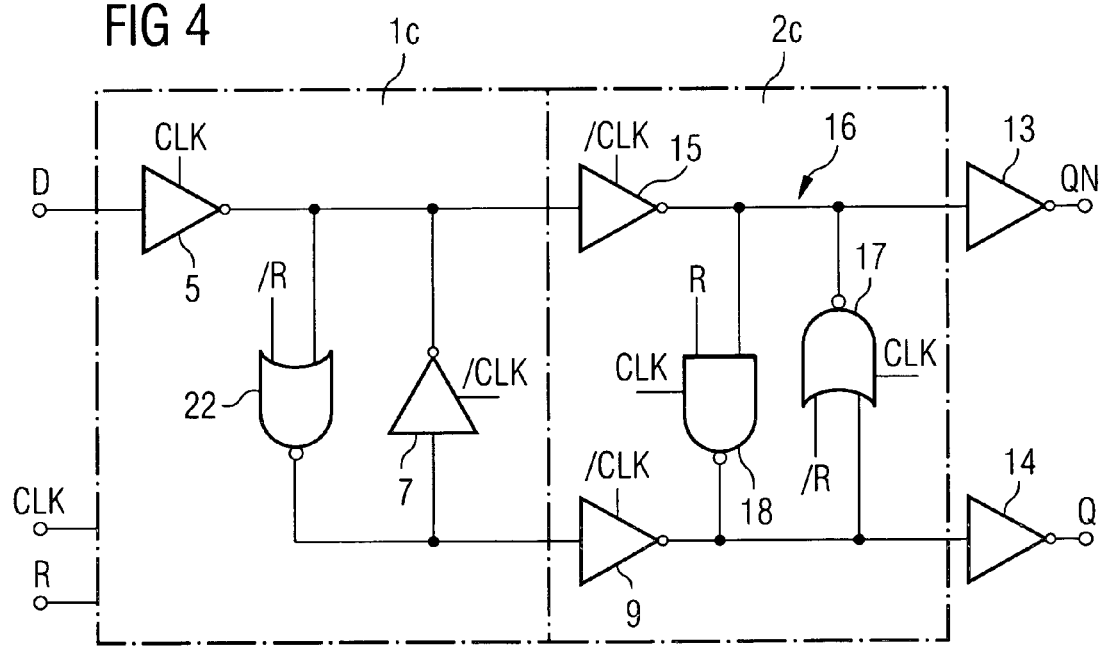

D-TYPE FLIPFLOP

CROSS-REFERENCE TO RELATED APPLICATIONS

This application claims foreign priority benefits under 35 U.S.C. §119 to co-pending German patent application No. 102 50 866.6-42 DE, filed Oct. 31, 2002. This related patent application is herein incorporated by reference.

BACKGROUND OF THE INVENTION

1. Field of the Invention

The invention relates to a flipflop, particularly a D-type flipflop, having two complementary outputs, particularly for radio frequency applications.

2. Description of the Related Art

D-type flipflops have a data input to which a data signal is applied which is transferred using a clock edge of a clock signal applied to a clock input. They also frequently have two mutually complementary data outputs, a noninverting data output and an inverting data output. After a determined period of time, the noninverting data output produces the data item transferred from the data input. The inverting data output produces the inverted data item.

Conventional D-type flipflops are of two part design, comprising the master latch and the slave latch. Both latches have feedback loops which form a holding element in which a data item can be stored. While the data item at the data input is transferred to the master latch at a first clock level, a second, subsequent clock level prompts the data item to be transferred to the slave latch from the master latch and stored therein in the same way. A signal which is output from the slave latch's feedback loop is used as output signal which is applied to one of the data outputs, the signal which is complementary thereto being produced by inversion from the output signal using an inverter circuit.

Both output signals are thus generated from the same internal signal within the slave latch, with a path length which differs by an inverter being obtained for the output signal. The output signal generated using the additional inverter requires an increased propagation time, which means that the complementary output signals are applied with a time offset, as a result of which the maximum clock frequency at which the D-type flipflop can be operated is limited by the slowest output signal.

Particularly in the case of D-type flipflops having a reset function, the total propagation time is greater on account of the gates used in the slave latch.

It is an object of the present invention to provide a D-type flipflop for radio frequency applications in which the output signals are produced by the complementary outputs in a very short time and essentially simultaneously.

This object is achieved by the flipflop in accordance with patent claim 1. Other advantageous refinements of the invention are specified in the dependent claims.

SUMMARY OF THE INVENTION

The invention provides a flipflop having a clock input for applying a clock signal, a data input for applying a data signal, a noninverting output and an inverting output. The flipflop has a first holding element with a first feedback loop and a second holding element with a second feedback loop. The first and second feedback loops each have a first node and a second node. The first holding element is designed such that at a first clock level of the clock signal the logic value of the data signal is transferred to the first holding element and the logic value of the data signal is made available on the first node in the first feedback loop. The first node in the first feedback loop is coupled to the first node in the second feedback loop in order to transfer the signal value which is on the first node in the first feedback loop to the second holding element at a second clock level of the clock signal and to output the signal value on the inverting output. The second node in the first feedback loop is coupled to the second node in the second feedback loop in order to transfer the inverted signal value which is on the second node in the first feedback loop to the second holding element at the second clock level of the clock signal. The second node in the second feedback loop corresponds to the noninverting output and the first node in the second feedback loop corresponds to the inverting output.

The inventive flipflop thus has two holding elements connected in series, as does a flipflop based on the prior art. In contrast to the flipflop based on the prior art, the holding elements are coupled to one another not by one connection but rather by two connections, with essentially the first nodes in the first and second feedback loops and the second nodes in the first and second feedback loops being connected to one another. This means that once the two nodes in the first feedback loop have been set to a particular level in the first holding element by virtue of the data signal being transferred, a further, subsequent clock level of the clock signal essentially simultaneously transfers the signal values of the two nodes in the first feedback loop to the second holding element, which means that the first and second nodes in the second feedback loop are simultaneously stipulated by the respective signal values from the first node and the second node in the first feedback loop. In this way, the propagation-time difference when the signal values are transferred to the two nodes in the second feedback loop is eliminated during reading.

In the prior art, the propagation-time difference arises as a result of the level of the first node in the second feedback loop firstly being set and then, by means of inversion, the level of the second node in the second feedback loop being set. If the complementary outputs were now to be tapped off on the two nodes, then the two complementary output signals at the second clock level would be produced on the outputs with a time delay which roughly corresponds to the signal propagation time through the element or elements in a feedback path in the second feedback loop. This is disadvantageous particularly in the case of radio frequency applications.

Preferably, the first and second feedback loops are negative-feedback inverter circuits, which means that a feedback loop can be produced in a simple manner.

Flipflops are edge controlled. Preferably, therefore, provision is also made for a first clock edge formed by the first clock level and by the second clock level to run in the opposite direction to the second clock edge, i.e., if the first clock edge is a falling edge then the second clock edge is a rising edge of the clock signal. In this case, the data item applied to the data input can be made available at the output of the flipflop within a short time after the second clock edge is applied.

Preferably, a first clock-controlled inverter is provided for transferring the data signal to the first holding element, said inverter transferring the data signal in inverted form to the feedback loop at a first clock level, i.e., after the first clock edge, and inhibiting it at a second clock level, i.e., after the second clock edge. In this way, the data signal can be forwarded to the first feedback loop at defined times, as a result of which the first feedback loop is "programmed".

Provision can also be made for the first nodes in the two feedback loops and the second nodes in the feedback loops each to be coupled via second clock-controlled inverters which, as a result of the change to the second clock level, transfer the respective signal value in inverted form to the corresponding nodes in the second feedback loop and inhibit it at the first clock level. This ensures that the signal value stored in the first holding element is not transferred to the second holding element until the second part of the clock cycle.

Provision can also be made for there to be a reset input which can have a reset signal applied to it. The second feedback loop has a NOR gate whose first input has the reset signal applied to it. This allows the output of the flipflop to be reset independently of the clock signal. Provision can also be made for the second feedback loop to have a NAND gate whose first input has the reset signal applied to it.

The NOR gate and the NAND gate can be partially clocked, i.e., for the signal value which is to be stored or which is to be output the gate's operation is dependent on the respective clock level, while the input of the gate to which the reset signal is applied puts the output of the respective gate at the value determined by the reset signal, regardless of the clock. This has the advantage that the reset signal causes the complementary outputs of the flipflop to be reset immediately and independently of the clock signal.

Provision is preferably made for the first node in the first feedback loop and the first node in the second feedback loop and/or the second node in the first feedback loop and the second node in the second feedback loop to be additionally coupled via a transmission gate. It is advantageous to provide a transmission gate between the first and second holding elements because this allows a signal delay to be achieved in order to prevent the data signal from actually passing through the first holding element to the second holding element at the first clock level in the event of the second clock-controlled inverter switching too slowly from the inversion function to the inhibit function. This is a measure to prevent the applied data signal from actually being switched through to the second feedback loop upon the change from the second to the first clock level in the case of poorly dimensioned components.

Provision can also be made for the first feedback loop to have a NOR gate, so that the first node carries a logic "0" and the second node, upon inversion by the corresponding clock-controlled inverter, carries a logic "1" as soon as a reset signal has been activated. The second node and the first node in the first feedback loop have a decoupling circuit arranged between them in order to isolate the second node in the first feedback loop from the second node in the second feedback loop and to apply a logic "0" to the first node in the second feedback loop when the reset signal has been activated. Preferably, the decoupling circuit has an inverter and/or a transmission gate which can be switched by the reset signal. The effect achieved by this decoupling circuit is that, when a reset signal is applied, the data signal applied, which gives rise to a signal value on the second node in the first feedback loop, does not bring about the same signal values on the two nodes in the second feedback loop at the second clock edge. Identical states on the nodes in the second feedback loop result in an unstable state.

BRIEF DESCRIPTION OF THE DRAWINGS

Preferred embodiments of the invention are explained in more detail below with the reference to the appended drawings, in which:

FIG. 1 shows a conventional D-type flipflop having two complementary outputs;

FIG. 2 shows a D-type flipflop having two complementary outputs and reset functions based on the prior art;

FIG. 3 shows a D-type flipflop having two complementary outputs based on a first embodiment of the invention;

FIG. 4 shows a D-type flipflop having two complementary outputs, reset function based on a second embodiment of the invention;

Identical reference symbols correspond to identical components of comparable function.

DETAILED DESCRIPTION OF THE PREFERRED EMBODIMENT

Figure 5:
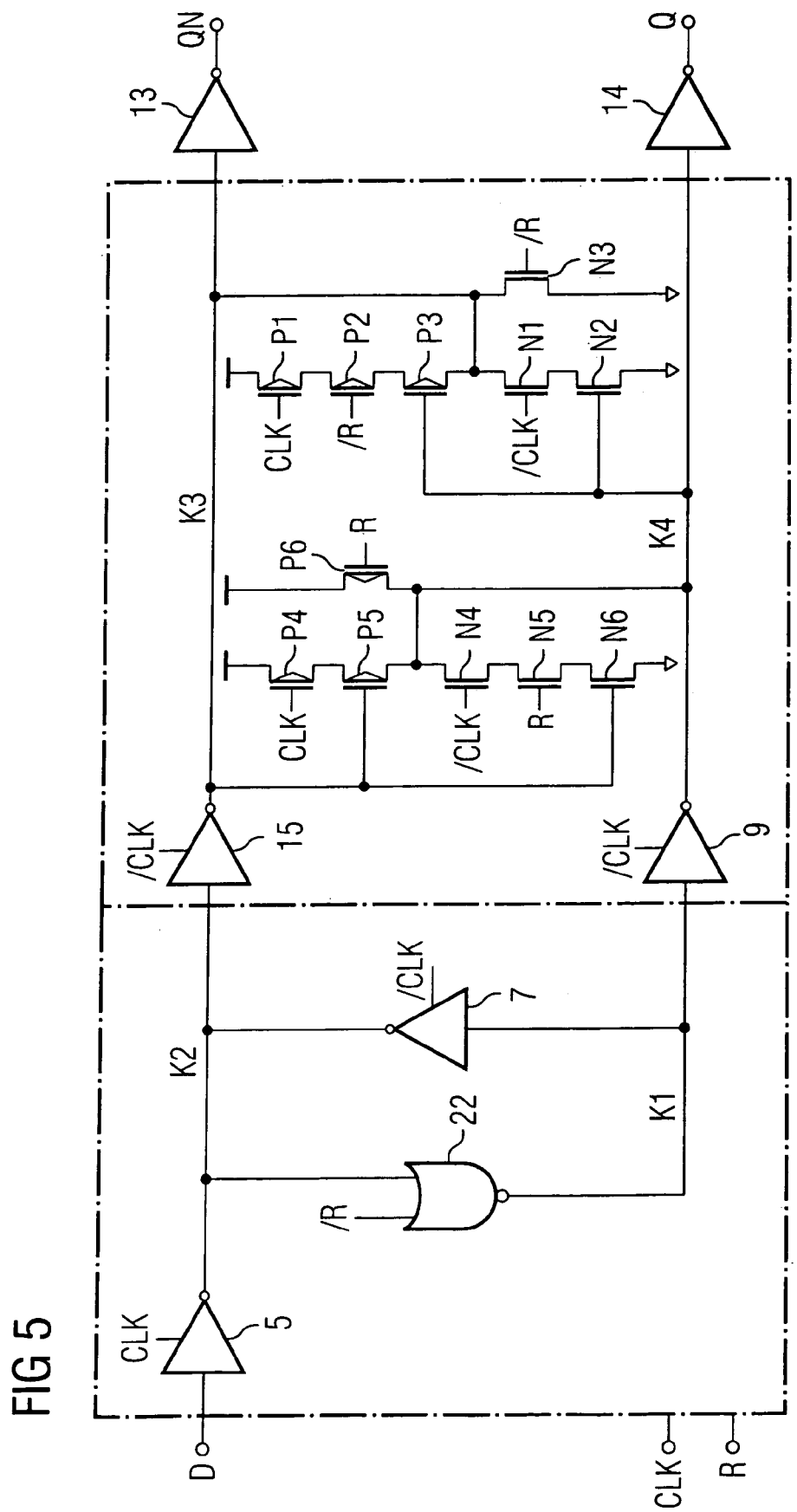
FIG. 5 shows a D-type flipflop based on the embodiment shown in FIG. 4 with a detailed schematic of a partially clock-controlled NOR gate and a partially clock-controlled NAND gate.

FIG. 1 shows a D-type flipflop based on the prior art. It has a first holding element 1 and a second holding element 2. The first holding element can be actuated via a clock input 4 and a data input 3. A clock signal CLK is applied to the clock input 4 and a data signal D is applied to the data input.

The first holding element 1 has a first clock-controlled inverter 5. The input of the first clock-controlled inverter 5 has the data signal D applied to it. The first clock-controlled inverter 5 has a clock input to which the clock signal CLK is applied. A clock-controlled inverter is normally designed such that the signal applied to its signal input is output in inverted form to the output when the clock signal CLK has adopted a low level at its clock input. When the clock signal CLK has adopted a high level at the clock input of the clock-controlled inverter, the clock-controlled inverter turns off.

The output of the first clock-controlled inverter 5 is connected to a feedback loop 6. The feedback loop 6 has a second clock-controlled inverter 7 and a non-clock-controlled third inverter 8. The clock input of the second clock-controlled inverter 7 is connected to an inverted clock signal /CLK, so that the second clock-controlled inverter 7 is switched essentially in alternation with the first clock-controlled inverter 5. That is to say that when the first clock-controlled inverter 5 inverts, the second clock-controlled inverter 7 turns off, and vice-versa.

The output of the first clock-controlled inverter 5 is connected to an input of the third inverter 8 and forms a second node K2. An output of the third inverter 8 is connected to a signal input of the second clock-controlled inverter 7 and represents a first node K1. A signal output of the second clock-controlled inverter 7 is connected to the second node, i.e., to the signal input of the third inverter 8.

In this way, the second clock-controlled inverter 7 and the third inverter 8 form the feedback loop 6 with the first node K1 at the output of the third inverter 8 and with the second node K2 at the output of the second clock-controlled inverter 7. The feedback loop 6 is thus in a form such that the first and second nodes K1, K2 carry respective inverted signal values which are each held at the high level of the clock signal CLK.

When a signal which is to be stored is applied as a data signal D to the data input 3, the signal value of the data signal D is transferred to the first holding element 1 at a low clock level of the clock signal CLK. In this regard, the inversion by the first clock-controlled inverter 5 first causes the second node K2 to carry the inverted data signal and hence the first node K1 to carry the uninverted data signal.

The clock input of the second clock-controlled inverter 7 has an inverted clock signal /CLK applied to it. Since the second clock-controlled inverter 7 is thus off for a low state of the clock signal CLK and inverts the applied input signal only for a high state of the clock signal CLK, the feedback loop is in a deactivated state at first. Only when the clock signal CLK changes from a low state to the high state does the second clock-controlled inverter 7 start to operate and inverts the signal value which is on the node K1 and forwards the inverted signal value to the second node K2. The feedback loop 6 is thus active and holds the data item written in previously. At the same time, when the clock signal CLK has adopted a high state, the first clock-controlled inverter 5 is deactivated, which means that any signal change occurring on the data input 3 leaves the stored data item in the first holding element 1 unaffected.

The second holding element 2 of the D-type flipflop is of essentially identical design to the first holding element 1. The data value stored in the first holding element 1 is tapped off from the first node K1 and is supplied to an input of a fourth clock-controlled inverter 9. The signal output of the fourth clock-controlled inverter 9 is connected to a second feedback loop 10. A clock input of the fourth clock-controlled inverter 9 has the inverted clock signal /CLK applied to it. In this way, the first node K1 is coupled to the second feedback loop 10 via the clock-controlled inverter 9.

The second feedback loop 10 has a fifth clock-controlled inverter 11 and a sixth inverter 12, which is not clock-controlled. The output of the fourth clock-controlled inverter 9 is connected to a signal input of the sixth inverter 12. A signal output of the sixth inverter 12 is connected to a signal input of the fifth clock-controlled inverter 11. A signal output of the fifth clock-controlled inverter 11 is connected to the signal input of the sixth inverter 12. The signal input of the sixth inverter 12 provides a fourth node K4, and the signal output of the sixth inverter 12 provides a third node K3.

Shortly after the rising edge of the clock signal CLK, the third node K3 thus carries the signal value of the data signal which has been applied to the flip-flop. The fourth node K4 thus carries the signal value which is the inverse thereof. To decouple the second feedback loop 10 from the downstream circuit as far as possible, output drivers in the form of a seventh inverter 13 and an eighth inverter 14 are provided. The signal input of the seventh inverter 13 is connected to the third node K3. Its signal output then provides the inverted output signal QN. The signal input of the eighth inverter 14 is connected to the fourth node K4 and its signal output provides the uninverted output signal Q.

The flipflop based on the prior art as described above has the drawback that the signals, i.e., the uninverted output signal Q and the inverted output signal QN, cannot be provided simultaneously at the respective signal outputs of the seventh and eighth inverters 13, 14. This is because the signal propagation time for the inverted output signal QN at the output of the seventh inverter 13 is greater than the signal propagation time for the uninverted output signal Q at the output of the eighth inverter 14. The reason for this is that the rising edge of the clock signal CLK after the fourth clock-controlled inverter 9 has been activated actually produces the corresponding signal at the uninverted signal output Q after the signal propagation time through the eighth inverter 14, while the inverted output signal QN is produced at the corresponding signal output after the signal propagation times through the sixth inverter 12 and the seventh inverter 13.

FIG. 2 shows a D-type flipflop which can be reset using an asynchronous reset signal R, which means that the uninverted output produces a signal value of "0" and the inverted output produces a signal value of "1". In the embodiment shown, the reset signal is a low-active signal, which means that resetting occurs when the reset signal has adopted a low level.

The D-type flipflop has a third holding element 1a and a fourth holding element 2a. Basically, the circuit shown in FIG. 2 differs from that shown in FIG. 1 by virtue of the third inverter 8 in the third holding element 1a being replaced by a NOR gate 22. A first signal input on the NOR gate 22 is connected to the second node K2 and a second signal input on the NOR gate 22 is connected to the inverted reset signal /R. The output of the NOR gate 22 is connected to the first node K1 and to the signal input of the fourth clock-controlled inverter 9 in the fourth holding element 2a.

In the same way, the sixth inverter 12 in the fourth holding element 2a is replaced by a second NOR gate 16. A first signal input on the second NOR gate 16 is connected to the fourth node K4 and a second signal input on the second NOR gate 16 is connected to the inverted reset signal /R (low-active). A signal output on the second NOR gate 16 is connected to the third node K3.

The way in which the first NOR gate 22 and the second NOR gate 16 work is that, when a reset signal R instructing that the flipflop be reset is applied, the first node K1 and the third node K3 are immediately set to "0", i.e., regardless of the clock signal CLK applied. Since the two output signals are taken from the fourth holding element 2a in this circuit too, there is also a time delay here between application of the uninverted and inverted output signals to the uninverted output Q and to the inverted output QN.

FIG. 3 shows a D-type flipflop based on a first embodiment of the present invention. In the text below, identical reference symbols essentially correspond to identical elements. While a fifth holding element 1b in the inventive flipflop essentially corresponds to the first holding element 1 based on the prior art, a sixth holding element 2b has a further, ninth clock-controlled inverter. The sixth inverter 12 is in the form of a clock-controlled sixth inverter 12'. In addition to the coupling between the first node K1 and the fourth node K4 via the fourth clock-controlled inverter 9, the second node K2 and the third node K3 in the first and second feedback loops are coupled to one another via an additional ninth clock-controlled inverter 15 whose clock input has the inverted clock signal /CLK applied to it. The coupling is made via the fourth clock-controlled inverter 9 and the ninth clock-controlled inverter 15, so that the signal values which are on the first and second nodes K1, K2 are taken as a basis for setting the signal values on the third and fourth nodes K3, K4. That is to say that the rising edge of the clock signal CLK activates the fourth clock-controlled inverter 9 and the ninth clock-controlled inverter 15, which means that the signal outputs of said inverters now produce the complementary signal levels of the first and second nodes K1, K2.

A data signal D applied to the data input 3 is transferred to the first holding element 1b upon a falling edge of the clock signal CLK, so that the inverted signal value of the data signal D is on the second node K2 and the uninverted signal value of the data signal D is on the first node K1. The rising edge of the clock signal CLK deactivates the first clock-controlled inverter 5 and activates the second clock-controlled inverter 7, so that the first feedback loop 6 stores the signal value prescribed by the data signal D.

The rising edge of the clock signal CLK transfers the state levels of the first node K1 and the second node K2 to the sixth holding element 2b, so that the third node K3 takes on the inverted state level of the second node K2, and the fourth node K4 takes on the inverted state level of the first node K1. The subsequent falling edge of the clock signal CLK deactivates the fourth clock-controlled inverter 9 and the ninth clock-controlled inverter 15 and activates the fifth clock-controlled inverter 11 and the sixth clock-controlled inverter 12', so that the feedback loop formed by the two inverters 11, 12' stores the state levels of the third node K3 and the fourth node K4.

As soon as the clock-controlled fourth inverter 9 and the clock-controlled ninth inverter 15 are activated, the node K3 carries the signal value of the data signal D and the node K4 carries the inverted signal value of the data signal D. The seventh inverter 13 is connected to the third node K3, and the inverted output signal QN can thus be tapped off at its output. The fourth node K4 has the eighth inverter 14 connected to it, which means that the uninverted output signal Q can be tapped off at the latter's output.

The period of time after which the signal value of the data signal D is produced on the outputs Q, QN is determined essentially by the rising clock edge and the fourth clock-controlled inverter 9 and ninth clock-controlled inverter 15 which are at the input of the sixth holding element 2b and also by the seventh inverter 13 and the eighth inverter 14. The feedback loops can be implemented using small, i.e., low-power, transistors, i.e., the transistors in the second clock-controlled inverter 7 and in the third inverter 8 in the first holding element and in the fifth and sixth clock-controlled inverters 11, 12', in the second holding element. In this case, however, it should be remembered that the third inverter 8 in the fifth holding element 1b essentially determines the setup time for the D-type flipflop. The third inverter 8 therefore needs to be chosen such that it can drive the inputs of the second clock-controlled inverter 7 and of the fourth clock-controlled inverter 9 without the setup time becoming too great.

FIG. 4 shows a D-type flipflop based on a second embodiment. The D-type flipflop has an asynchronous reset function and, for this reason, comprises a reset input R. The reset signal which is to be applied to the reset input can be applied as a low-active signal, i.e., the D-type flipflop is reset when the reset signal R has adopted a low state.

A seventh holding element 1c essentially corresponds to the third holding element 1a in the prior art flipflop shown in FIG. 2. The seventh holding element 1c is coupled to an eighth holding element 2c, in line with the first embodiment of the invention, by means of the connections between the first and second nodes K1, K2 in the seventh holding element 1c and the third and fourth nodes in the eighth holding element 2c.

The eighth holding element 2c likewise has the fifth clock-controlled inverter 9 and the ninth clock-controlled inverter 15 which respectively transfer the signal value on the first node K1 and on the second node K2 to the eighth holding element 2c upon a rising edge of the clock signal.

The eighth holding element 2c has a third feedback loop 16 which comprises a partially clocked NOR gate 17 and a partially clocked NAND gate 18. The first signal input of the partially clocked NOR gate 17 is connected to the signal output of the fifth clock-controlled inverter 9. The partially clocked NOR gate 17 has a second signal input, to which an inverted reset signal /R is applied. The signal output of the NOR gate 17, like the signal output of the ninth clocked inverter 15, is connected to a first signal input on the NAND gate 18. These provide the third node K3. A second signal input on the NAND gate 18 is connected to the reset signal R, which can preferably be formed by reinversion of the already inverted reset signal /R. A signal output on the NAND gate 18 is connected to the first signal input of the NOR gate 17. The signal outputs of the fifth clock-controlled inverter 9 and of the NAND gate 18 and also the first signal input of the NOR gate 17 form the fourth node K4.

The inverted output signal is tapped off from the node K3 using the seventh inverter 13, and the uninverted output signal is tapped off via the node K4 using the eighth inverter 14.

Both the NOR gate 17 and the NAND gate 18 are partially clocked gates. That is to say that, in respect of the respective first signal input, the gate operates like a corresponding unclocked logic gate during a first state of the clock signal, while the gate switches to a tristate mode for a second state of the clock signal CLK, which means that the signal output of the respective gate is switched to high impedance.

The partial clocking of the NOR gate 17 and of the NAND gate 18 means that only the logic processing of the signal at the respective first input is dependent on the clock signal, while the applied reset signal R at the respective second signal input directly prompts a change at the signal outputs, i.e., regardless of the clock signal CLK.

FIG. 5 shows the D-type flipflop based on the embodiment shown in FIG. 4, with the transistor circuits of the NOR gate 17 and of the NAND gate 18 being shown. The NOR gate 17 has three series-connected p-channel transistors, the first p-channel transistor P1, the second p-channel transistor P2 and the third p-channel transistor P3.

A first connection on the first p-channel transistor P1 is connected to a supply voltage VDD. A second connection on the first p-channel transistor P1 is connected to a first connection on the second p-channel transistor P2, and a second connection on the second p-channel transistor P2 is connected to a first connection on the third p-channel transistor P3. The NOR gate 17 also has three n-channel transistors, a first n-channel transistor N1, a second n-channel transistor N2 and a third n-channel transistor N3. A second connection on the third p-channel transistor P3 is connected to the third node K3 and to a first connection on the first n-channel transistor N1. A second connection on the first n-channel transistor N1 is connected to a first connection on the second n-channel transistor N2, and a second connection on the second n-channel transistor N2 is connected to a ground potential GND. A first connection on the third n-channel transistor N3 is connected to the third node K3 and a second connection on the third n-channel transistor N3 is connected to the ground potential GND.

A control input on the first p-channel transistor P1 has the clock signal CLK applied to it. The control input of the second p-channel transistor P2 has the inverted reset signal /R applied to it. The control input of the third p-channel transistor P3 and the control input of the second n-channel transistor N2 are connected to the fourth node K4, i.e., to the signal output of the fifth clock-controlled inverter 9. A control input on the first n-channel transistor N1 has the inverted clock signal /CLK applied to it. The control input of the third n-channel transistor N3 is likewise connected to the inverted reset signal /R.

A NOR gate of such a design causes an active reset signal R, i.e., the reset signal R adopts a low level, to turn on the third n-channel transistor N3, so that the third node K3 is pulled to a ground potential GND. This happens regardless of the clock signal CLK. If the reset signal R is not applied, then the NOR gate 17 operates in accordance with a clock-controlled inverter, in which case essentially the operation of the sixth clock-controlled inverter 12' based on the first embodiment is simulated. That is to say that the signal value on the fourth node K4 is inverted as soon as the clock signal CLK has adopted a low level. While the clock signal CLK is at a high level, the inverter is switched to high impedance, which means that the third node K3 does not have a signal applied to it via the NOR gate 17.

The NAND gate 18 has three p-channel transistors, a fourth p-channel transistor P4, a fifth p-channel transistor P5 and a sixth p-channel transistor P6. It also has a fourth n-channel transistor N4, a fifth n-channel transistor N5 and a sixth n-channel transistor N6. A connection on the fourth p-channel transistor P4 is connected to the supply voltage potential VDD, a second connection on the fourth p-channel transistor P4 is connected to a first connection on the fifth p-channel transistor P5, and a second connection on the p-channel transistor P5 is connected to the fourth node K4. A first connection on the sixth p-channel transistor P6 is connected to the supply voltage potential VDD and a second connection on the sixth p-channel transistor P6 is connected to the fourth node K4. A first connection on the fourth n-channel transistor N4 is connected to the fourth node, a second connection on the fourth n-channel transistor N4 is connected to a first connection on the fifth n-channel transistor N5, a second connection on the fifth n-channel transistor N5 is connected to a first connection on the sixth n-channel transistor N6 and a second connection on the sixth n-channel transistor N6 is connected to a ground potential GND.

A control input on the fourth p-channel transistor P4 is connected to the clock input. A control input on the fifth p-channel transistor P5 and a control input on the sixth n-channel transistor N6 are connected to the third node K3. Control inputs on the sixth p-channel transistor P6 and on the fifth n-channel transistor N5 are connected to the reset signal R. A control input on the fourth n-channel transistor N4 is connected to the inverted clock signal /CLK.

The NAND gate 18 operates in the following manner: when an active reset signal R is applied, the sixth p-channel transistor P6 is turned on, regardless of the clock signal CLK applied. If no active reset signal R is applied, the fifth p-channel transistor P5 and the sixth n-channel transistor N6 form a clock-controlled inverter for the signal value which is on the third node K3. The inverter is on in the low state of the clock signal CLK and is off for a high state of the clock signal CLK, which means that the fourth node K4 does not have a signal applied to it by the NAND gate 18.

In general, the operation of the NOR gate 17 and of the NAND gate 18 can be described in that they operate like the clocked inverters, the fifth clock-controlled inverter 11 and the sixth clocked inverter 12' based on the first embodiment when the reset signal R is at a high level, i.e., when the reset function has not been activated. The gates are connected such that they are switched to a tristate mode when the clock signal CLK is in a high state, so that no feedback occurs. The gates become active when the clock signal CLK changes to a low state.

Figure 6:
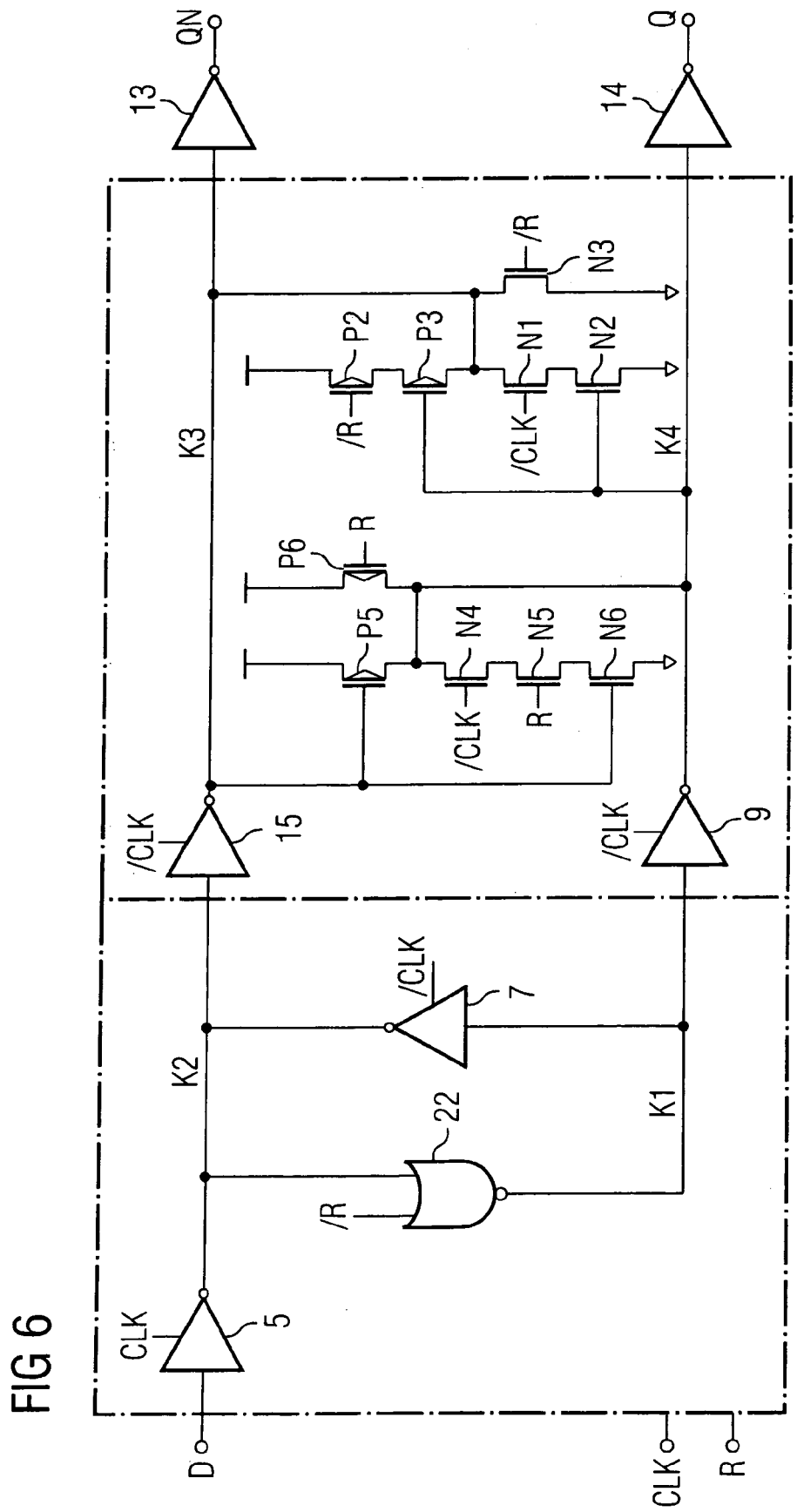
FIG. 6 shows a D-type flipflop having a reset function with reduced pull-up paths in the feedback loop in the slave latch.

FIG. 6 shows a similar circuit to that in FIG. 5, with the first p-channel transistor P1 having been omitted in the NOR gate 17 and the fourth p-channel transistor P4 having been omitted in the NAND gate 18. Since the feedback loops are produced using minimal transistors, the pull-up capability of the feedback loops is low. In the case of technologies using weak p-channel transistors, such as EDRAM technologies, it is therefore possible, depending on the delay, the surface area and the complexity for the layout, to dispense with clocking the pull-up paths in the second holding element's feedback loop, since the pull-down capability of the clocked inverters at the input of the second holding element, namely the fifth clocked inverter 9 and the ninth clocked inverter 15, may suffice for sufficiently fast switching even without this clocking. In this case, the increase in the delay between the clock signal CLK and the inverted output signal is extremely small, whereas the surface area of the circuit can be significantly reduced if necessary.

Figure 7:
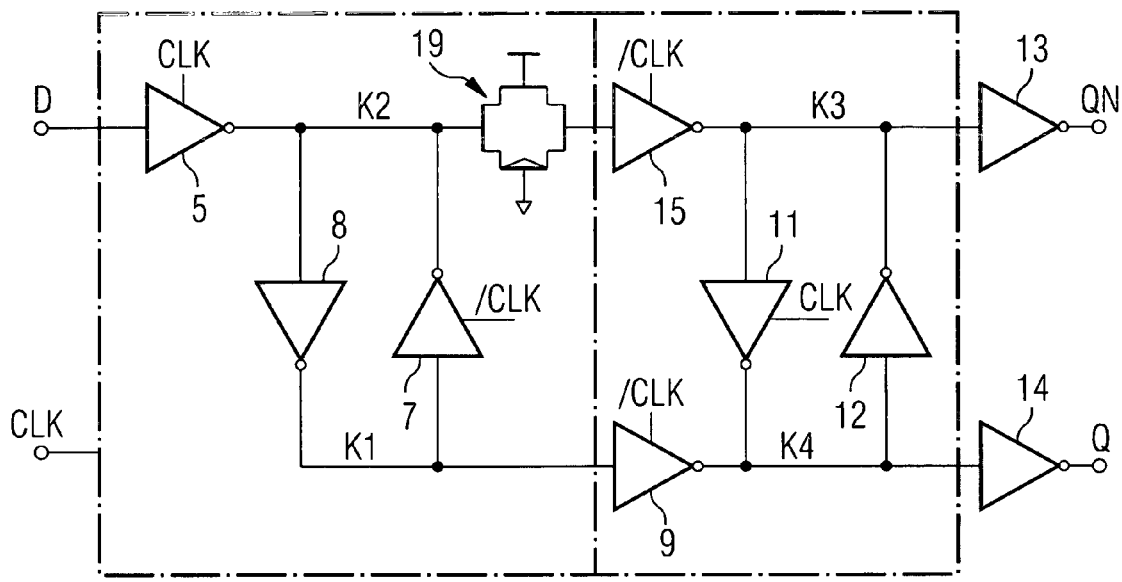
FIG. 7 shows a D-type flipflop having two complementary outputs and a delay circuit based on a third embodiment of the invention.

FIG. 7 shows a further improvement in the flipflop based on the first embodiment, as shown in FIG. 3.

The coupling between the second node K2 and the third node K3 is effected not just exclusively via the ninth clock-controlled inverter 15 but also via a permanently on transmission gate 19. The transmission gate 19 causes the signal carried by the second node K2 to be applied to the input of the ninth transistor 15 essentially with a slight delay. This is helpful because, upon a falling clock edge, the inverted data signal D from the signal output of the first clock-controlled inverter 5 reaches the second node K2 very quickly. The result of this can be that, if the ninth clock-controlled inverter 15 does not switch fast enough from the inverter mode to the tristate mode, the inverted data signal is actually transferred from the second node K2 to the third node K3 upon the falling edge of the clock signal CLK and brings about an unstable state in the second feedback loop. This is not wanted, since, in the case of a synchronous flipflop of this type, the output signal is not intended to be transferred to the second holding element until the rising edge. The transmission gate 19 now causes a slight delay in the signal propagation time between the second node K2 and the signal input of the ninth clock-controlled inverter 15, which means that this inverter 15 has enough time to switch to the tristate mode.

Figure 8:
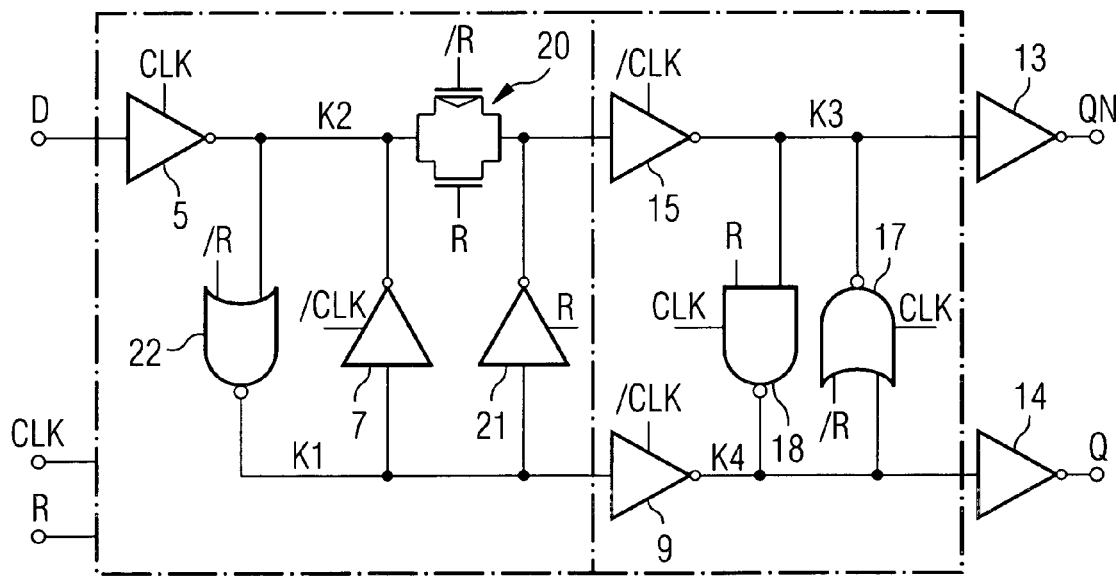
FIG. 8 shows a D-type flipflop having a decoupling circuit based on a fourth embodiment of the invention.

FIG. 8 shows a flipflop, similar to the embodiment shown in FIG. 4, in which a decoupling circuit ensures that identical signal values are not respectively written to the nodes in the second feedback loop. To this end, the second node K2 is connected to the signal input of the ninth clock-controlled inverter 15 via a second transmission gate 20. The transmission gate 20 is controlled by the reset signal, so that the transmission gate is on only when the reset signal R has been deactivated. If an active reset signal R is applied, the transmission gate 20 turns off.

The signal input of the ninth clock-controlled inverter 15 likewise has a signal output on a tenth controlled inverter 21 connected to it, the latter's signal input being connected to the first node K1. The tenth inverter 21 is controlled by means of the reset signal R and operates as an inverter when the reset signal R has been activated, i.e., is in a low state.

When the reset signal R has been activated, this feedback loop from the second node K2 to the signal input of the ninth clock-controlled inverter is interrupted. Instead, the feedback loop is replaced by the tenth controlled inverter 21, which is operational when the reset signal R has been activated.

The transmission gate 20 makes it possible to prevent the situation that, upon a signal change in the data signal D from a low level to a high level during a low level of the clock signal, i.e., from a high level to a low level of the signal level on the second node K2, the signal input of the ninth clock-controlled inverter 15 is likewise pulled to a low level briefly or essentially at the same time as a reset signal R is applied. This would result in the third node K3 and the fourth node K4 in the second holding element each being given a high state, which would result in an impermissible state. Introducing the tenth controlled inverter 21 puts the signal input of the ninth clock-controlled inverter 15 at the required signal value when a reset signal R has been activated.

Instead of the tenth inverter 21, it is also possible to provide a single transistor (not shown) which is controlled by the reset signal R and which applies a high potential to the input of the ninth clock-controlled inverter 15 when the reset signal has been activated.

It goes without saying that it is also possible to provide further implementation options in this case, e.g. using an AND gate or the like. The principle involves the negative effects of a signal change at the data input 3 during or at a similar time to activation of the reset signal R being prevented.

The various embodiments of the first holding element and the various embodiments of the second holding element can be connected to one another in any desired combination, since they do not exclude one another.

What is claimed is:

1. A flipflop circuit, comprising:
a clock input for applying a clock signal;
a data input for applying a data signal;
an noninverted output;
an inverted output;
a first holding element comprising a first feedback loop comprising a first node and a second node; and
a second holding element comprising a second feedback loop comprising a third node and a fourth node; wherein the first node is coupled to the fourth node via a first signal path and the second node is coupled to the third node via a second signal path exclusive of the first signal path, the second signal path including a delay element in the form of a transmission gate permanently switched on when the circuit is in a normal operating mode;
wherein the first holding element is configured such that at a first clock level of the clock signal the logic value of the data signal is transferred to the first holding element and the logic value of the data signal is made available on the first node, and the inverted logic value of the data signal is made available on the second node; and
wherein the second holding element is configured such that at a second clock level of the clock signal (i) the logic value of the data signal is transferred, and inverted, from the first node to the fourth node, thereby making the inverted logic value of the data signal available on the fourth node, and (ii) the inverted logic value of the data signal is transferred, and inverted, from the second node to the third node, thereby making the noninverted logic value of the data signal available on the third node; wherein the fourth node in the second feedback loop corresponds to the noninverted output and the third node in the second feedback loop corresponds to the inverted output.

2. The flipflop of claim 1, wherein at least one of the first and the second feedback loops comprises a negative-feedback inverter circuit formed by two inverting logic elements, wherein an input of each inverter is coupled to an output of the other inverting logic element.

3. The flipflop of claim 1, further comprising an inverter configured to transfer, and invert, the data signal to the first holding element at the first clock level and further configured to inhibit transfer of the data signal at the second clock level.

4. The flipflop of claim 1, further comprising a first clock-controlled inverter disposed in the first signal path and a second clock-controlled inverter disposed in the second signal path, wherein each clock-controlled inverter is configured to transfer a respective signal value at the second clock level and inhibit signal value transfer at the first clock level.

5. A flipflop circuit, comprising:
a clock input for applying a clock signal;
a data input for applying a data signal;
an noninverted output;
an inverted output;
a first holding element comprising a first feedback loop comprising a first node and a second node;
a second holding element comprising a second feedback loop comprising a third node and a fourth node; wherein the first node is coupled to the fourth node via a first signal path and the second node is coupled to the third node via a second signal path exclusive of the first signal path;
wherein the first holding element is configured such that at a first clock level of the clock signal the logic value of the data signal is transferred to the first holding element and the logic value of the data signal is made available on the first node, and the inverted logic value of the data signal is made available on the second node;
wherein the second holding element is configured such that at a second clock level of the clock signal (i) the logic value of the data signal is transferred, and inverted, from the first node to the fourth node, thereby making the inverted logic value of the data signal available on the fourth node, and (ii) the inverted logic value of the data signal is transferred, and inverted, from the second node to the third node, thereby making the noninverted logic value of the data signal available on the third node; wherein the fourth node in the second feedback loop corresponds to the noninverted output and the third node in the second feedback loop corresponds to the inverted output;
a reset input configured to receive a reset signal, and wherein the second feedback loop comprises a NOR gate comprising a first input having the reset signal applied thereto; and
wherein the second feedback loop further comprises a NAND gate comprising a first input having an inverted version of the reset signal applied thereto.

6. The flipflop of claim 5, wherein at least one of the NOR gate and the NAND gate are partially clocked.

7. The flipflop of claim 6, wherein at least one of the first node and the fourth node and the second node and the third node are coupled via a transmission gate.

8. A flipflop circuit, comprising:
a clock input for applying a clock signal;
a data input for applying a data signal;
an noninverted output;
an inverted output;
a first holding element comprising a first feedback loop comprising a first node and a second node;
a second holding element comprising a second feedback loop comprising a third node and a fourth node;

wherein the first node is coupled to the fourth node via a first signal path and the second node is coupled to the third node via a second signal path exclusive of the first signal path;

wherein the first holding element is configured such that at a first clock level of the clock signal the logic value of the data signal is transferred to the first holding element and the logic value of the data signal is made available on the first node, and the inverted logic value of the data signal is made available on the second node;

wherein the second holding element is configured such that at a second clock level of the clock signal (i) the logic value of the data signal is transferred, and inverted, from the first node to the fourth node, thereby making the inverted logic value of the data signal available on the fourth node, and (ii) the inverted logic value of the data signal is transferred, and inverted, from the second node to the third node, thereby making the noninverted logic value of the data signal available on the third node; wherein the fourth node in the second feedback loop corresponds to the noninverted output and the third node in the second feedback loop corresponds to the inverted output;

a reset input configured to receive a reset signal, and wherein the second feedback loop comprises a NOR gate comprising a first input having the reset signal applied thereto;

wherein the first feedback loop comprises a NOR gate, so that the second node carries a logic "1" in response to an active state of the reset signal;

wherein the first feedback loop further comprises a decoupling circuit disposed between the first node and the second node and configured to isolate the second node from the third node in the second feedback loop; and wherein the NOR gate of the first feedback loop is configured to apply a logic "0" to the fourth node in the second feedback loop when the reset signal is in the active state.

9. The flipflop of claim 8, wherein the decoupling circuit comprises a transmission gate configured to be switched by the reset signal and an inverter controlled by the reset signal.

10. A resettable flipflop circuit, comprising:

a single data input;

non-inverted and inverted output nodes for providing non-inverted and inverted logic levels, respectively, of a data signal received via the single data input at a first edge of a clock signal;

a first holding element comprising a first feedback loop with first and second nodes, wherein, on the first edge of the clock signal, the non-inverted and inverted logic levels of the data signal are transferred to the first and second nodes, respectively; and a second holding element comprising a second feedback loop with third and fourth nodes, wherein, on a second edge of the clock signal, the non-inverted logic level is transferred from the first node to the non-inverted output node via the fourth node and the inverted logic level is transferred from the second node to the inverted output node via the third node;

wherein a propagation delay of the non-inverted logic level from the first node to the non-inverted output node is substantially equal to a propagation delay of the inverted logic level from the second node to the inverted output node and at least the first and second feedback loops each comprise reset circuitry to place the inverted and non-inverted output nodes at known logic levels in response to a reset signal regardless of the state of the clock signal;

wherein the reset circuitry of the second feedback loop comprises one or more gates, each controlled by the clock signal and responsive to the reset signal; and wherein the one or more gates of the second feedback loop comprise:

a NOR gate with a first input to receive an inverted version of the reset signal, a second input coupled with the fourth node, and an output coupled with the third node; and a NAND gate with a first input to receive a non-inverted versions of the reset signal, a second input coupled with the third node, and an output coupled with the fourth node of the second input of the NOR gate.

\* \* \* \* \*